(12) United States Patent
Uchida et al.

(10) Patent No.: US 7,869,483 B2
(45) Date of Patent: Jan. 11, 2011

(54) SURFACE EMITTING LASER

(75) Inventors: Takeshi Uchida, Tokyo (JP); Yasuhiro Nagatomo, Hachioji (JP); Yuichiro Hori, Kawasaki (JP); Mitsuhiro Ikuta, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 71 days.

(21) Appl. No.: 12/425,745

(22) Filed: Apr. 17, 2009

(65) Prior Publication Data

US 2009/0262775 A1 Oct. 22, 2009

(30) Foreign Application Priority Data

Apr. 21, 2008 (JP) ............... 2008-109883

(51) Int. Cl.
*H01S 3/08* (2006.01)
(52) U.S. Cl. ............ 372/99; 372/5; 372/43.01; 372/44.01; 372/50.124; 372/87; 372/98; 372/108; 385/129; 385/131
(58) Field of Classification Search ............ 372/5, 372/43.01, 44.01, 50.124, 87, 98, 99, 108; 385/129, 131
See application file for complete search history.

(56) References Cited

U.S. PATENT DOCUMENTS

| | | | | |
|---|---|---|---|---|
| 6,829,281 B2 * | 12/2004 | Deng et al. | ............... | 372/96 |
| 7,539,226 B2 | 5/2009 | Uchida | ............... | 372/43.01 |
| 7,680,168 B2 | 3/2010 | Uchida | ............... | 372/43.01 |
| 7,684,460 B2 | 3/2010 | Hori | ............... | 372/99 |
| 7,697,586 B2 | 4/2010 | Ikuta | ............... | 372/50.124 |
| 7,697,588 B2 | 4/2010 | Hori et al. | ............... | 372/99 |
| 7,796,662 B2 | 9/2010 | Uchida et al. | ............ | 372/46.013 |
| 7,796,665 B2 | 9/2010 | Ikuta | ............... | 372/50.124 |
| 7,796,666 B2 | 9/2010 | Nagatomo | ............ | 372/50.124 |
| 7,796,667 B2 | 9/2010 | Ikuta | ............... | 372/50.124 |
| 2007/0201526 A1 * | 8/2007 | Hori | ............... | 372/50.124 |
| 2007/0280318 A1 * | 12/2007 | Yoshimoto et al. | ........ | 372/43.01 |
| 2008/0304532 A1 | 12/2008 | Uchida | ............... | 372/50.124 |
| 2009/0035884 A1 | 2/2009 | Ikuta | ............... | 438/29 |
| 2009/0074026 A1 | 3/2009 | Nagatomo et al. | ..... | 372/50.124 |
| 2009/0135876 A1 | 5/2009 | Takeuchi et al. | ......... | 372/50.11 |
| 2009/0196318 A1 | 8/2009 | Uchida | ............... | 372/45.01 |
| 2009/0232179 A1 | 9/2009 | Ikuta | ............... | 372/50.124 |
| 2010/0029027 A1 | 2/2010 | Ikuta et al. | ............... | 438/29 |
| 2010/0029030 A1 | 2/2010 | Uchida et al. | ............... | 438/34 |
| 2010/0166034 A1 | 7/2010 | Ikuta | ............... | 372/46.014 |
| 2010/0220763 A1 | 9/2010 | Ikuta | ............... | 372/50.124 |

FOREIGN PATENT DOCUMENTS

| | | |
|---|---|---|
| JP | 2000-332351 | 11/2000 |
| JP | 2006-165309 | 6/2006 |
| WO | WO 2007029538 A1 * | 3/2007 |

\* cited by examiner

*Primary Examiner*—Minsun Harvey
*Assistant Examiner*—Yuanda Zhang
(74) *Attorney, Agent, or Firm*—Fitzpatrick, Cella, Harper & Scinto

(57) ABSTRACT

A surface emitting laser which oscillates at a wavelength $\lambda$ of a blue band, including a photonic crystal layer including a photonic crystal structure, an active layer provided on one surface of the photonic crystal layer, and an electrode provided on the other surface of the photonic crystal layer for injecting electric current into the active layer. The photonic crystal structure has a thickness of 100 nm or more. A laser beam is emitted toward a direction opposite to a side of the photonic crystal layer on which the electrode is provided.

10 Claims, 7 Drawing Sheets

SURFACE EMITTING LASER

BACKGROUND OF THE INVENTION

1. Field of the Invention

The present invention relates to a surface emitting laser, and particularly relates to a surface emitting laser of a blue band using a photonic crystal.

2. Description of the Related Art

In recent years, a surface emitting laser which can emit light in a direction vertical to a substrate has received attention.

For instance, a vertical resonator type surface emitting laser (VCSEL: Vertical Cavity Surface Emitting Laser) is a laser which emits a laser beam in a direction vertical to a substrate, and has an advantage of being easily two-dimensionally arrayed in high density.

Japanese Patent Application Laid-Open No. 2006-165309 proposes a surface emitting laser provided with a photonic crystal structure.

FIG. 10 illustrates a structure of the surface emitting laser using the photonic crystal structure disclosed in Japanese Patent Application Laid-Open No. 2006-165309.

This surface emitting laser has an n-type cladding layer 1004, an active layer 1005, a first p-type cladding layer 1006, a photonic crystal structure 1007, a second p-type cladding layer 1008 and a contact layer 1009 laminated in this order on a substrate 1003, as is illustrated in FIG. 10.

This photonic crystal structure 1007 is formed by providing holes in a semiconductor layer.

This laser adopts a structure of confining light by an optical waveguide which is constituted by the active layer 1005 as the core layer of the waveguide, the n-type cladding layer 1004 and the p-type cladding layers 1006 and 1008.

A periodic change of refractive index in a plane direction originating in the photonic crystal structure causes a feedback function for light, and a resonator having a resonance mode in the in-plane direction is formed due to the feedback function.

This photonic crystal structure also plays a role of a diffraction grating which diffracts a part of a light resonating in the in-plane direction to a vertical direction.

In other words, the resonance direction of the surface emitting laser described in Japanese Patent Application Laid-Open No. 2006-165309 is a horizontal direction with respect to the substrate, and the surface emitting laser emits a part of the resonating light to a vertical direction by a high order diffraction of the photonic crystal structure.

The structure disclosed in Japanese Patent Application Laid-Open No. 2006-165309 needs a thick first p-type cladding layer 1006 and a thick second p-type cladding layer 1008 in order to confine light.

However, such a thick cladding layer causes the increase of electric resistance, consequently causes the increase of voltage and the degradation of power efficiency, and gives an influence on device characteristics.

In addition, the first p-type cladding layer 1006 and the second p-type cladding layer 1008 need to have a lower refractive index than an active layer 1005, and accordingly employ a semiconductor of a ternary solid solution crystal containing Al, for their materials in many cases.

For instance, in Japanese Patent Application Laid-Open No. 2006-165309, $Al_{0.08}Ga_{0.92}N$ is used as the p-type cladding layer 1008.

However, such a ternary solid solution crystal has a problem of showing higher electric resistance than a binary crystal. Then, it is considered to reduce the thickness of the p-type cladding layer, in order to lower the electric resistance.

However, when the thickness of the p-type cladding layer is simply reduced, the distance between an electrode and the active layer is narrowed, which causes a problem that the electrode absorbs the horizontally resonating light. In other words, when the p-type cladding layer is thinned so as to lower the electric resistance, the p-type cladding layer cannot inhibit light from leaking, and the light is absorbed by the electrode, which may reduce emission efficiency.

SUMMARY OF THE INVENTION

In view of the above described problem, an object of the present invention is to provide a surface emitting laser using a photonic crystal structure, which lowers electric resistance originating in a cladding layer and also can inhibit light from being absorbed by an electrode.

A surface emitting laser according to the present embodiment has a semiconductor layer including a photonic crystal structure, (which may be referred to as "photonic crystal layer", hereinafter), formed in a laminate structure.

The surface emitting laser has a structure in which an active layer for amplifying light is provided on one surface of the semiconductor layer, an electrode for injecting electric current into the active layer is provided on the other surface, and a laser beam is emitted from a side opposite to the side on which the electrode is provided.

The hole constituting the photonic crystal structure is set so as to have a depth of 100 nm or more, which can inhibit light from leaking to the electrode. As a result, a cladding layer to be provided between the photonic crystal structure and the electrode can be made thin or can be eliminated, while inhibiting the light from being absorbed by the electrode. As a result, the electrode and the active layer can be closely arranged to lower the electric resistance.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

Figure 1:
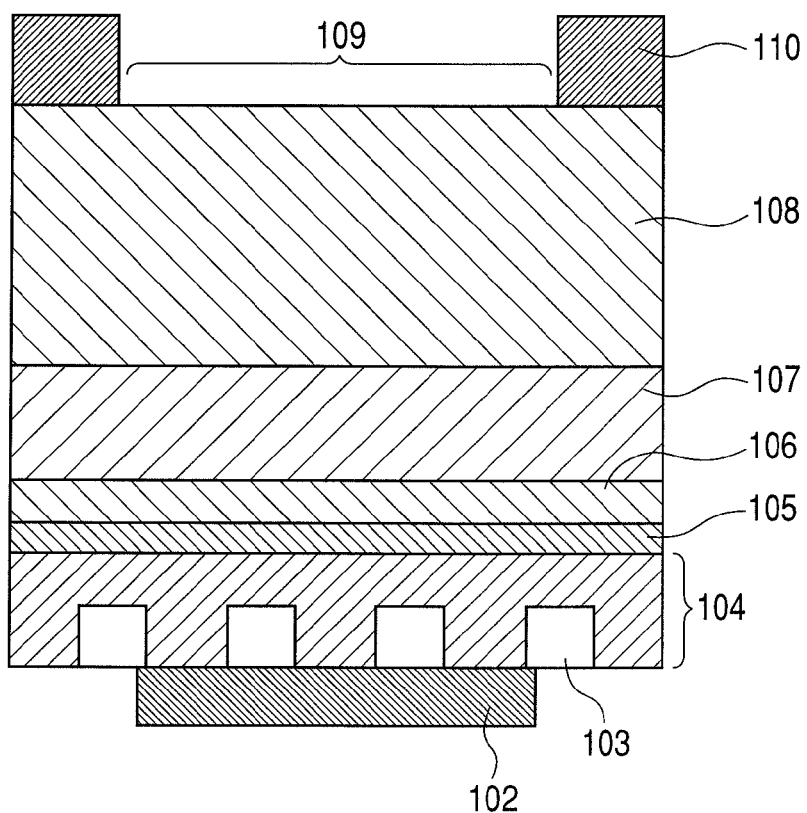
FIG. 1 is a schematic sectional view for describing a structure of a photonic-crystal surface emitting laser according to an embodiment of the present invention.

FIG. 1 illustrates a view illustrating a layer structure of a photonic-crystal surface emitting laser according to the present embodiment.

In FIG. 1, a p-type electrode 102, a photonic crystal structure 103, a p-GaN layer 104 as a photonic crystal layer, and an active layer 105 are shown.

An n-GaN layer 106, an AlGaN cladding layer 107 (n-type cladding layer), a GaN substrate 108, a light extraction window 109 and an n-electrode 110 are also shown in FIG. 1.

The surface emitting laser of the present embodiment is constituted by a plurality of semiconductor layers including the photonic crystal structure 103 laminated on the GaN substrate 108, and is structured so as to emit a laser beam from a rear face side with respect to the laminated face of the above described semiconductor layers and have an oscillation wavelength $\lambda$.

Specifically, the p-type electrode 102 is formed so as to contact with the p-GaN layer 104 (photonic crystal layer) in which the photonic crystal structure 103 has been produced up to the middle of the layer, as is illustrated in FIG. 1.

The active layer 105 is formed on a side of this photonic crystal layer 104 opposite to a side on which the above described p-type electrode is formed, and the n-GaN layer 106 and the n-type cladding layer 107 are formed so as to contact with the active layer. The substrate 108 for growing each of the above described semiconductor layers thereon is formed on a side of this n-type cladding layer 107 opposite to a side in which the above described n-GaN layer 106 is formed.

Then, the n-side electrode 110 and the light extraction window 109 are provided on the rear face side of the substrate.

The surface emitting laser in the present embodiment realizes light confinement by providing a hole in the photonic crystal layer to form the photonic crystal structure and to decrease the refractive index.

It was found that when the depth of the hole is set at 100 nm or more, the above described light confinement is sufficient, and the absorption of light by the electrode can be avoided even though the electrode is arranged on the photonic crystal layer.

Next, the numeric range will now be described with reference to a calculation model.

Figure 2:
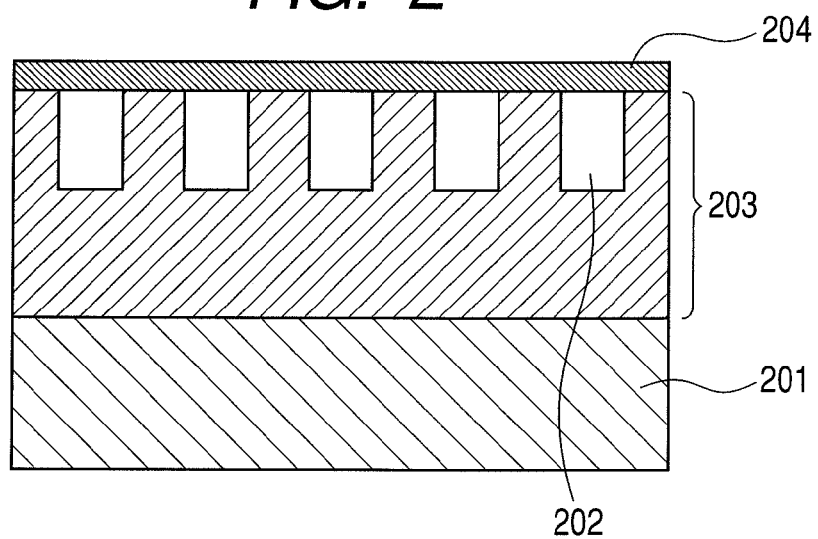
FIG. 2 is a calculation model for calculating optical absorption by an electrode in the embodiment of the present invention.

FIG. 2 shows a calculation model for evaluating the resonance and optical absorption in a photonic crystal structure.

In FIG. 2, a cladding layer 201 corresponding to '107' of FIG. 1, a photonic crystal structure 202 corresponding to '103' of FIG. 1, a high refractive index layer 203 corresponding to the combination of '104', '105' and '106' of FIG. 1 and an electrode metal 204 are shown.

This calculation model is a slab waveguide structure having a passive photonic-crystal structure 202, and the metal 204 is formed on the upper part of the photonic crystal structure 202.

Figure 3:
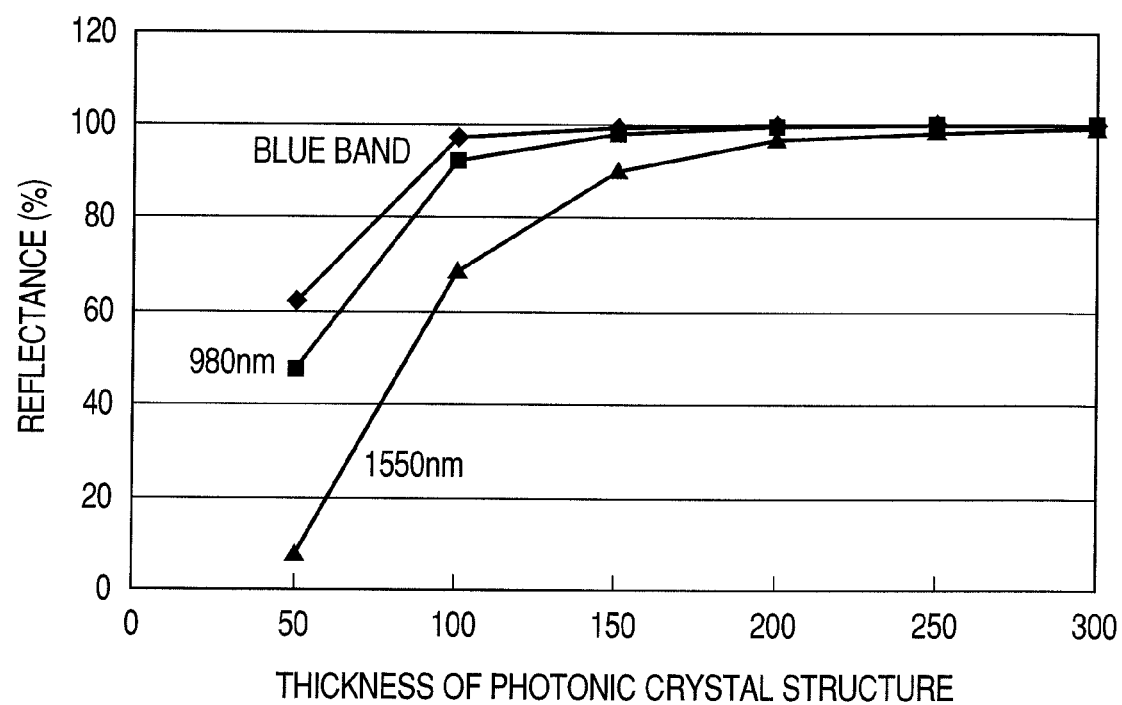
FIG. 3 is a view illustrating a relationship between absorption by an electrode and the depth of a hole constituting a photonic crystal structure, in the embodiment of the present invention.

FIG. 3 shows a result of having calculated reflectance shown when a light is incident from the cladding layer 201 side. The horizontal axis in FIG. 3 is the thickness of photonic crystal structure, which is equal to the depth of the hole 103. When the metal absorbs little light, the incident light is coupled with the waveguide due to diffraction, causes the resonance and then returns to the incident side, so that the reflectance closes to 100%. On the other hand, when the metal absorbs the light, the reflectance is lowered.

In the above calculation, it is assumed that a material system which is generally used for the wavelength band illustrated in the figure is employed. For instance, a GaN-based material is used for a blue band (370 nm to 520 nm).

From this calculation result, it is understood that optical absorption by the metal can be inhibited by setting the depth of the hole constituting the photonic crystal structure at 100 nm or more, in the case of the blue band (370 nm to 520 nm).

The value obtained by dividing the 100 nm by (oscillation wavelength in vacuum/refractive index of semiconductor) is 0.62. In other words, it is satisfactory to employ 0.62 times or more the oscillation wavelength in the semiconductor constituting the photonic crystal layer.

In addition, in the case of the 980 nm band, the optical absorption due to the metal can be inhibited by setting the depth of the hole at 150 nm or more. In other words, the depth of the hole may be 0.53 times or more of the oscillation wavelength in the semiconductor constituting the photonic crystal layer.

Furthermore, in the case of the 1.550 nm band, the optical absorption due to the metal can be inhibited by setting the depth of the hole at 250 nm or more. In other words, the depth of the hole may be 0.54 times or more the oscillation wavelength in the semiconductor constituting the photonic crystal layer.

As described above, in any wavelength band, the optical absorption due to the metal can be inhibited by setting the depth of the hole at 0.50 times or more of the oscillation wavelength in the semiconductor constituting the photonic crystal layer. In a conventional structure described in the above described Japanese Patent Application Laid-Open No. 2006-165309, it has been difficult to reduce the thickness of the cladding layer while inhibiting the optical absorption.

However, a photonic crystal layer structure used in the present invention can inhibit the optical absorption by the electrode, because when the photonic crystal layer has a thickness that is approximately 0.50 times an oscillation wavelength in the semiconductor constituting the photonic crystal layer, sufficient light confinement can be secured.

Meanwhile, the structure of Japanese Patent Application Laid-Open No. 2006-165309 employs for a p-type semiconductor layer a semiconductor layer of a ternary solid solution crystal having a lower refractive index than an active layer 1005 and sandwich the active layer 1005 in order to realize the light confinement. Specifically, the active layer 1005 is sandwiched between an n-type cladding layer 1004 constituted by AlGaN and the first p-type cladding layer 1006, also constituted by AlGaN.

By contrast, the structure of the present embodiment does not need to employ a material constituted by a ternary solid solution crystal material having a lower refractive index than the active layer as the p-type cladding layer, and accordingly can lower the electric resistance.

Therefore, the present structure can closely arrange the active layer and the electrode while avoiding absorption in the electrode as described above, can constitute a device without using a p-type semiconductor of a ternary solid solution crystal having high electric resistance, and thereby can greatly lower the electric resistance compared to a conventional example.

In the above described embodiment, the photonic crystal layer 104 contacts with the p-type electrode 102. However, a p-type cladding layer which is thinned compared to that used in the prior art may be provided therebetween.

EXEMPLARY EMBODIMENTS

Exemplary embodiments according to the present invention will now be described below.

Exemplary Embodiment 1

In Exemplary embodiment 1, a photonic-crystal surface emitting laser to which the present invention is applied will be described.

Figure 4:
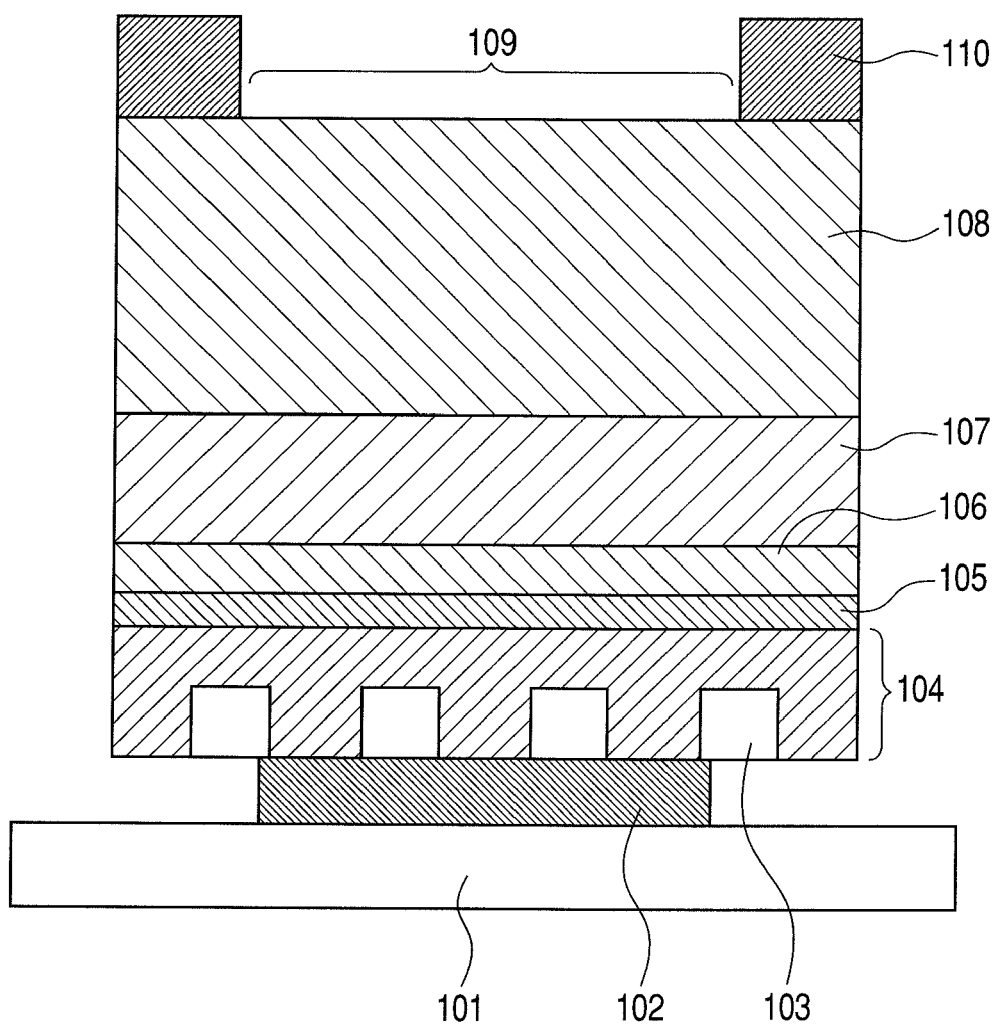
FIG. 4 is a schematic sectional view for describing a structure of a photonic-crystal surface emitting laser in Exemplary embodiment 1 of the present invention.

FIG. 4 illustrates a schematic sectional view for describing a structure of a photonic-crystal surface emitting laser to which the present invention is applied.

In FIG. 4, the same element as that illustrated in FIG. 1 is designated by the same reference numeral. An SiC substrate 101 has an electrode pattern on its surface.

The surface emitting laser of the present embodiment is constituted by a plurality of semiconductor layers including a photonic crystal structure 103 laminated on a GaN substrate 108, and emits a laser beam having a wavelength λ from the rear face side with respect to the laminated face of the semiconductor layers.

Specifically, a p-type electrode 102 is formed so as to contact with a p-GaN layer 104 (photonic crystal layer) in which the photonic crystal structure 103 has been produced up to the middle of the layer, and the other surface of this p-type electrode 102 is bonded to the SiC substrate 101, as is illustrated in FIG. 4.

In addition, an active layer 105 is provided on a side of the p-type semiconductor layer 104 opposite to a side on which the above described p-type electrode 102 is formed, an n-GaN layer 106 is formed so as to contact with this active layer 105 and an n-type cladding layer 107 is formed thereon.

Furthermore, a GaN substrate 108 for growing each of the above described semiconductor layers thereon is formed on a side of this n-type cladding layer 107 opposite to a side on which the above described n-GaN layer 106 is formed. Then, an n-side electrode 110 and a light extraction window 109 are provided on the rear face side of the GaN substrate 108.

The thickness of the above described p-type semiconductor layer 104 (photonic crystal layer) is 250 nm, and the photonic crystal layer 104 has therein a photonic crystal structure 103 having a depth of 150 nm and a radius of 64 nm at a pitch of 160 nm. The above described active layer 105 is constituted by three layers of InGaN quantum wells provided in an undoped GaN layer.

The n-GaN layer 106 has a thickness of 100 nm, and the AlGaN layer 107 which functions as a clad on this n-GaN layer has a thickness of 500 nm.

Incidentally, a p-electrode 102 is formed not on the whole surface of, but only on a part of the photonic crystal layer, and an injection region is almost determined by the electrode pattern, if the p-type semiconductor layer 104 is sufficiently thinned.

Therefore, the present structure can also effectively confine a carrier without using an current confinement structure.

Figure 5:
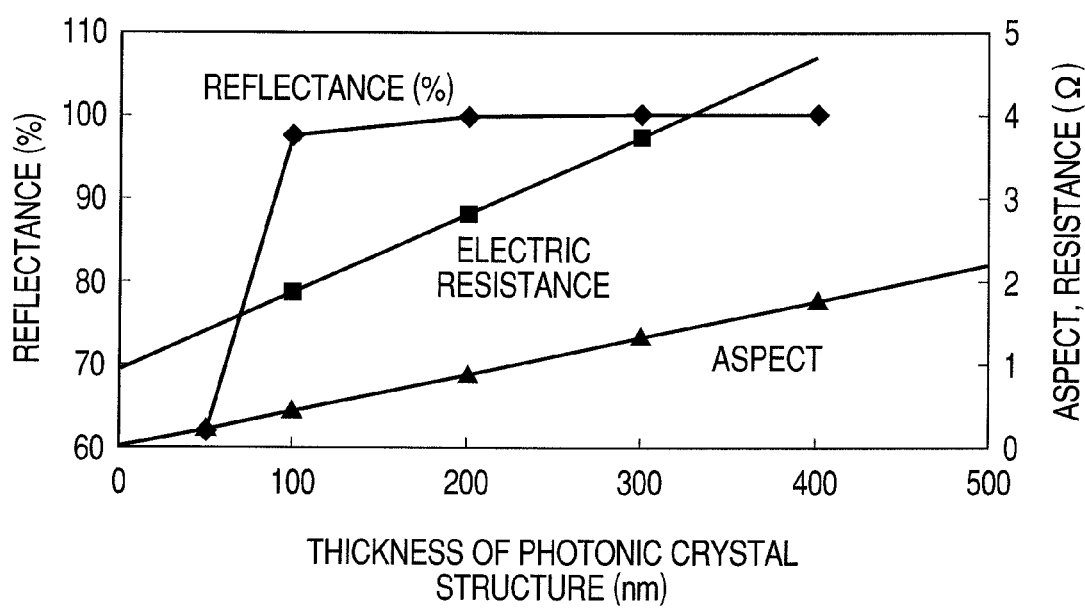
FIG. 5 is a view illustrating a calculation for electric resistance, hole aspect and reflectance in Exemplary embodiment 1 of the present invention.

FIG. 5 shows a calculation result of electric resistance shown when the thickness of a photonic crystal structure 103 (depth of hole) is varied in the structure of the present exemplary embodiment. Here, in the calculation, the thickness of the photonic crystal layer 104 is set at the sum of the thickness of the photonic crystal structure 103 and 100 nm.

For purpose of the comparison, the electric resistance was calculated on a laser described in Japanese Patent Application Laid-Open No. 2006-165309 on the assumption of having the same doping concentration. As a result, the electric resistance was 17Ω.

By contrast, in the structure of the present exemplary embodiment, when the thickness of the photonic crystal structure is 100 nm, the electric resistance is 1.8Ω, and when the thickness is 300 nm, the electric resistance is 3.7Ω. It is understood that the electric resistance is greatly lowered into about ⅕ compared to a conventional structure, as is illustrated in FIG. 5. When the thickness exceeds 400 nm, the electric resistance is twice or more the electric resistance shown when the thickness is 100 nm.

Therefore, the thickness of the photonic crystal structure is favorably 400 nm or less from the viewpoint of the electric resistance, in other words, the distance between the electrode 102 and the active layer 105 (thickness of photonic crystal layer) is favorably 500 nm or less.

The present structure can also lower thermal resistance as well as the electric resistance. The value of the thermal resistance in a conventional structure is 216 K/W, but the thermal resistance in the present proposed structure is 90 K/W. Thus, the present structure can greatly lower the thermal resistance.

In other words, the structure in the present exemplary embodiment can greatly lower the electric resistance compared to the surface emitting laser described in Japanese Patent Application Laid-Open No. 2006-165309, and also can lower the thermal resistance, which enables the device characteristics to be greatly improved.

Next, a method for producing a photonic-crystal surface emitting laser according to the present exemplary embodiment will now be described.

In a production method of the present exemplary embodiment, layers of an n-AlGaN cladding layer 107, an n-GaN layer 106, an active layer 105 including InGaN quantum wells and a p-GaN layer 104 are laminated in this order on an n-GaN substrate 108, by using an MOCVD method.

Subsequently, an Ni film of 5 nm and an Au film of 10 nm to be a p-electrode 102 are sequentially formed on the p-GaN layer 104 of the top surface.

Then, a photoresist is coated and is then developed, and a photonic crystal structure 103 is formed by using a dry etching method. The holes have a depth of 150 nm, a radius of 64 nm and a pitch of 160 nm. In FIG. 1, a hole in the p-electrode 102 is omitted for the sake of convenience, which is formed at the same time when the photonic crystal structure 103 is formed.

Here, before moving to a next step, a protection film is formed on the photonic crystal structure 103 for protecting the structure. Then, a photoresist pattern for forming a light extraction window 109 is formed on the rear face of the GaN substrate 108 so as to match the pattern of the photonic crystal structure 103, with the use of a double-sided mask aligner.

A Ti film of 50 nm and an Al film of 300 nm are sequentially formed as an n-type electrode 110, and then the light extraction window 109 is formed with a lift-off method.

Finally, an SiC substrate 101 on which a separately prepared solder material for bonding and a wiring pattern are formed is laminated with a GaN laser chip produced in the above steps. Thus, a device fabrication process is completed. Incidentally, in the present embodiment, the SiC substrate 101 is laminated on the p-electrode 102 after the p-electrode 102 has been formed on the p-GaN layer 104 with a vapor deposition technique, but the p-electrode 102 may be bonded to the p-GaN layer 104 after the p-electrode 102 has been formed on the SiC substrate 101.

In addition, in the present embodiment, the SiC substrate was employed as a submount, but a material other than the SiC substrate may be employed as long as the submount can form a wiring pattern thereon. For instance, a Si substrate may be employed.

In addition, a carrier barrier layer may be provided in the p-GaN layer 104 so as to inhibit carriers from leaking out from the active layer. The material of the carrier barrier layer includes AlGaN.

Exemplary Embodiment 2

In Exemplary embodiment 2, a structure example including a multilayer reflector in the photonic crystal layer will now be described.

In the present exemplary embodiment, the multilayer reflector formed of semiconductors is provided in the photonic crystal layer, and accordingly can enhance the light extraction efficiency.

Figure 6:
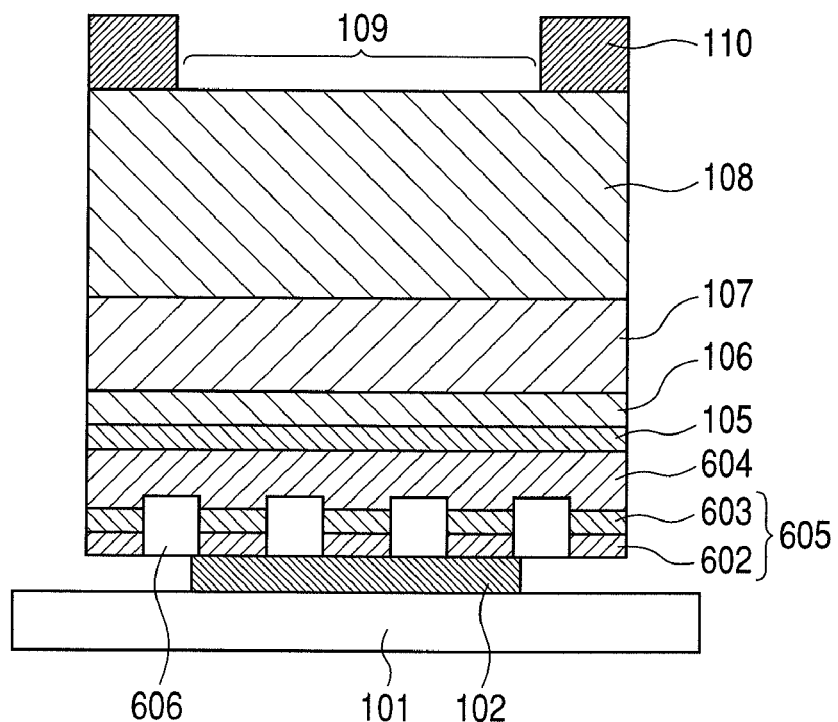
FIG. 6 is a schematic sectional view for describing a structure of a photonic-crystal surface emitting laser according to Exemplary embodiment 2 of the present invention.

FIG. 6 illustrates a schematic sectional view for describing a structure of a surface emitting laser in the present exemplary embodiment.

In FIG. 6, the same element as that illustrated in FIG. 1 is designated by the same reference numeral. The structure of the present exemplary embodiment has a semiconductor DBR 605 formed of laminated mirrors of a pair of two types of semiconductor layers 602 and 603 having mutually different refractive indices in the photonic crystal layer, which is a different point.

In the present exemplary embodiment, the first semiconductor layer 602 of the semiconductor DBR 605 is made from the same material as that of the p-type semiconductor layer in Exemplary embodiment 1, which is p-GaN here.

The second semiconductor layer 603 is made from a material having a lower refractive index than that of the first semiconductor layer 602, which is AlInN here.

A light diffracted toward the lower side of the photonic crystal layer can be returned to the upper part thereof by providing the semiconductor DBR 605, which can enhance the light extraction efficiency.

In addition, the reflectance of the light diffracted toward a vertical direction can be increased by the combination of the semiconductor DBR 605 and an electrode metal 102.

The DBR 605 is desirebly designed so as to show the most suitable reflectance for vertically incident light having an oscillation wavelength of a laser.

For instance, the thickness of each layer is different from that in a normally designed multilayer reflector. The thickness is not a one-quarter wavelength of the oscillation wavelength in each material, but needs to be designed in consideration of the distribution of light in PhC. In addition, the thickness of the top layer 602 needs to be determined in consideration of the shift of the phase due to an imaginary part of the refractive index of the metal.

Exemplary Embodiment 3

In Exemplary embodiment 3, a structure example will now be described in which a multilayer reflector formed of semiconductors is provided in a region on the laser beam emission side, which region is farther than the p-type semiconductor layer in the above described laminated structure.

A photonic-crystal surface emitting laser in the present exemplary embodiment is structured so that a DBR is formed in the n-side, and so that the Q-value and extraction efficiency can be controlled.

Figure 7:
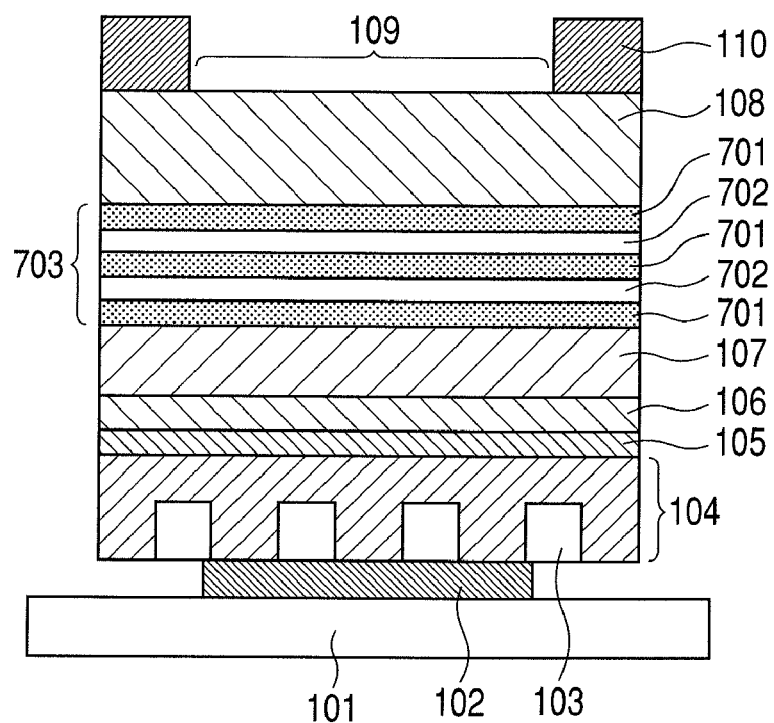
FIG. 7 is a schematic sectional view for describing a structure of a photonic-crystal surface emitting laser according to Exemplary embodiment 3 of the present invention.

FIG. 7 illustrates a schematic sectional view for describing a structure of a photonic-crystal surface emitting laser according to the present exemplary embodiment.

In FIG. 7, the same element as that illustrated in FIG. 1 is designated by the same reference numeral.

The present exemplary embodiment has basically the same structure as in Exemplary embodiment 1, but is different from Exemplary embodiment 1 in that a DBR 703 is provided on an n-cladding layer.

In the present exemplary embodiment, the DBR 703 is constituted by an n-GaN layer 701 and an n-AlGaN layer 702. The thickness of each layer is one-quarter of the resonance wavelength in the material constituting each layer. The DBR 703 is provided in order to control the Q-value of a resonator.

By providing this DBR 703 and controlling the distance between the DBR 703 and the active layer, the Q-value of the resonator can be independently controlled even without changing the diameter of a hole constituting a photonic crystal structure or the like.

For a laser, it is necessary to control the Q-value in order to optimize light extraction efficiency. The surface emitting laser having the present structure can set parameters further optimally.

For instance, when the Q-value is too high, the ratio of a light that dissipates before outgoing to the outside due to inner absorption increases, which lowers the light extraction efficiency.

When the Q-value is too low, the feedback of the light necessary for lasing cannot be obtained, and the resonator does not work as a laser.

In the structure of the present exemplary embodiment, the Q-value can be controlled by setting the distance between the DBR and the photonic crystal layer, so that such a photonic-crystal surface emitting laser can be provided as to give little influence to other parameters and be further optimized. Specifically, the Q-value can be controlled by controlling the thickness of the n-GaN layer 106 or the n-AlGaN layer 107.

Exemplary Embodiment 4

Figure 8:
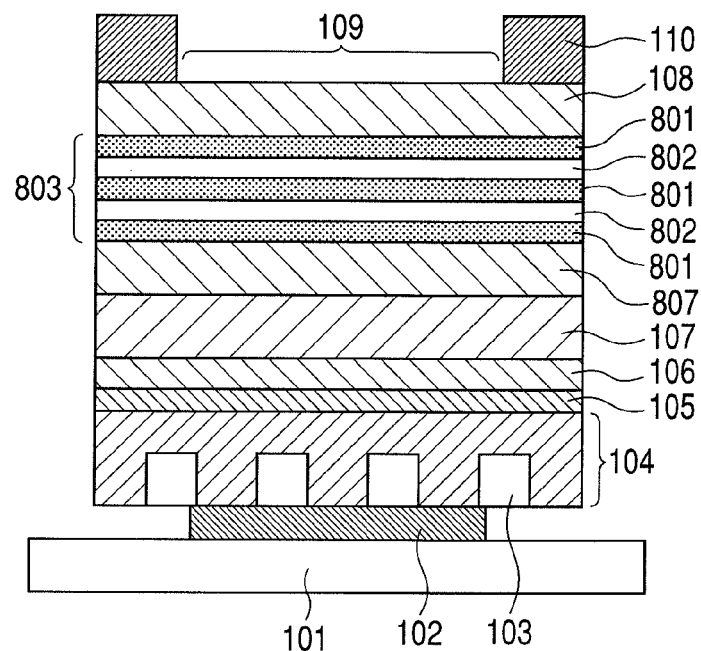
FIG. 8 is a schematic sectional view for describing a structure of a photonic-crystal surface emitting laser according to Exemplary embodiment 4 of the present invention.

In Exemplary embodiment 4, a structure example of a photonic-crystal surface emitting laser will now be described, in which a DBR is arranged closer to a light outgoing side than that in Exemplary embodiment 3 and resonance is caused in a vertical direction. In the present structure, a phenomenon of guided resonance (GR) is used. The GR is such a phenomenon that a diffraction grating and an optical waveguide resonate at a particular wavelength and provide a high reflectance. FIG. 8 illustrates a schematic sectional view of a structure of a surface emitting laser according to the present exemplary embodiment.

In FIG. 8, the same element as that illustrated in FIG. 1 is designated by the same reference numeral.

The present exemplary embodiment has basically the same structure as in Exemplary embodiment 3, but is different from Exemplary embodiment 3 in a point that a DBR 803 is arranged at a farther position layer than a DBR in Exemplary embodiment 3.

The surface emitting laser of the present exemplary embodiment is different from those in Exemplary embodiments 1 to 3 in that it lases in a vertical direction.

The surface emitting laser of the present exemplary embodiment is also different from those exemplary embodiments 1 to 3 in that the light overlap of a waveguide mode of in a horizontal direction and the active layer is decreased by decreasing the Q-value of the resonator and elongating the distance between the active layer and the photonic crystal layer.

In the present exemplary embodiment, the diffraction ratio is increased by enlarging the diameter of a hole constituting the photonic crystal structure.

As a result, in the photonic crystal layer, it becomes more difficult to lase in a horizontal direction than in the structures shown in Exemplary embodiments 1 to 3.

The surface emitting laser also lowers a threshold gain of the resonance mode in a vertical direction due to the GR of the DBR 803 provided on the upper part of the n-cladding layer 807 and the photonic crystal layer, so that it lases in a vertical direction.

Exemplary Embodiment 5

In Exemplary embodiment 5, a DBR on the n-side of Exemplary embodiment 4 is replaced with a photonic crystal layer which causes GR.

Figure 9:
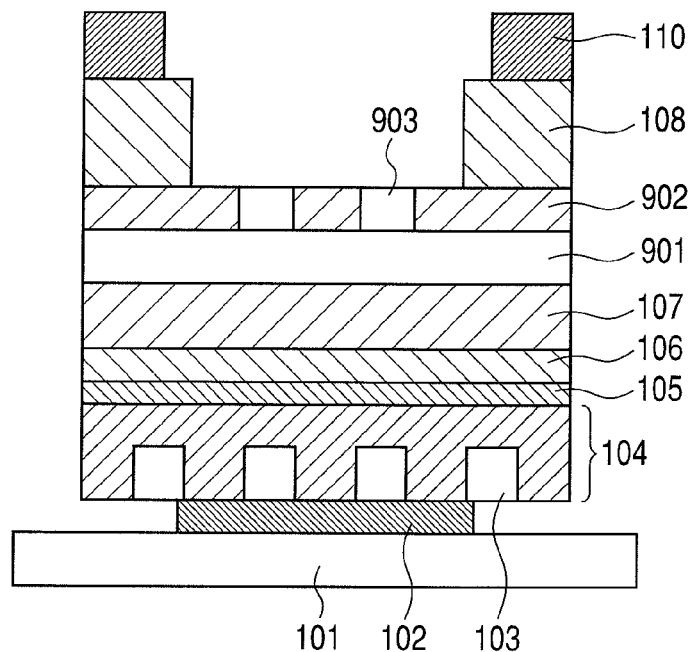
FIG. 9 is a schematic sectional view for describing a structure of a photonic-crystal surface emitting laser according to Exemplary embodiment 5 of the present invention.
Figure 10:
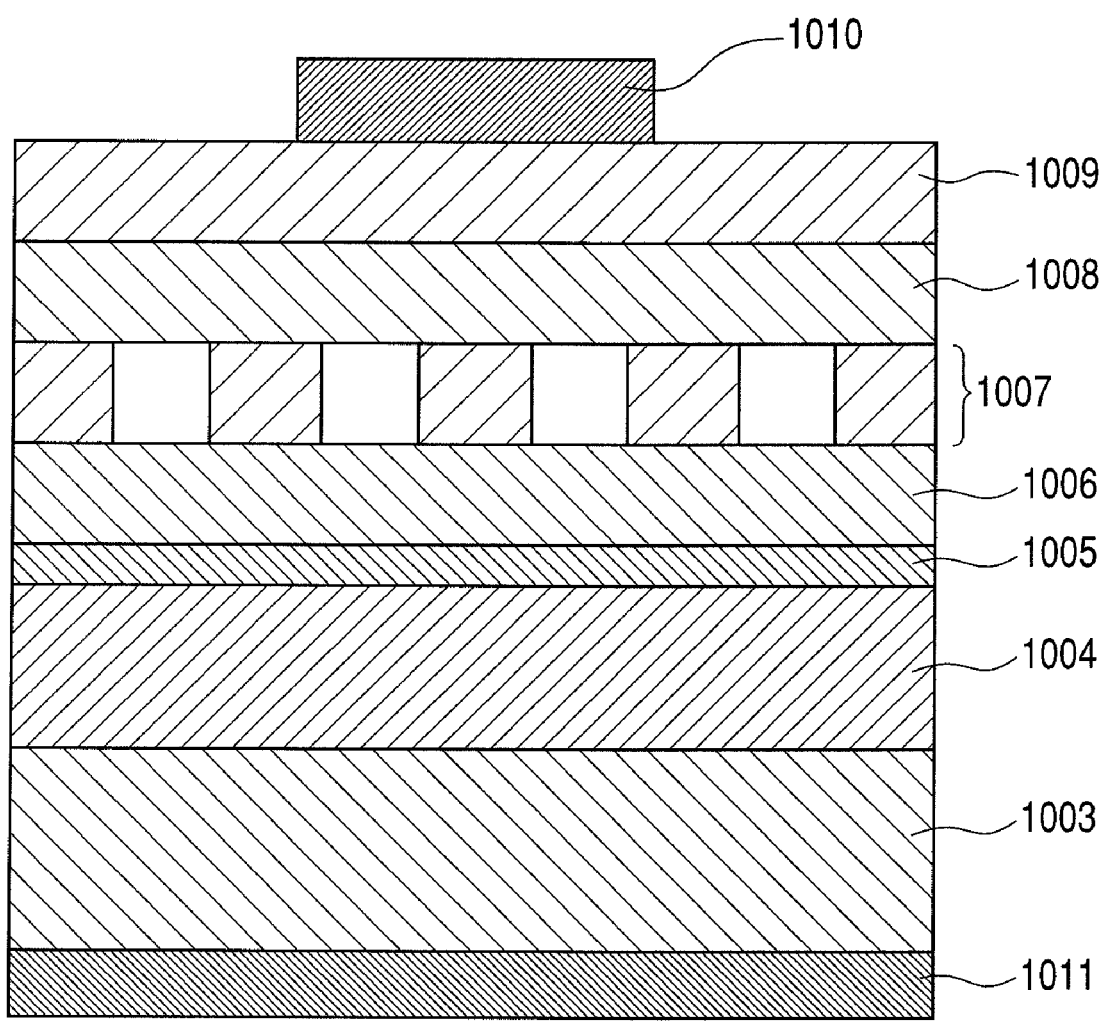
FIG. 10 is a sectional view of a device of Japanese Patent Application Laid-Open No. 2006-165309.

FIG. 9 illustrates a schematic sectional view for describing a structure of a photonic-crystal surface emitting laser according to the present exemplary embodiment.

In FIG. 9, the same element as that illustrated in FIG. 1 is designated by the same reference numeral.

The present exemplary embodiment basically has the same structure and works according to the same working principle as in Exemplary embodiment 4, and has the structure in which a DBR 803 of Exemplary embodiment 4 is replaced with a reflecting mirror formed of a photonic crystal layer 902.

A GR reflecting mirror is constituted by an n-GaN light guide layer and the photonic crystal layer 902, and resonance is caused in a vertical direction similarly to Exemplary embodiment 4.

In the present exemplary embodiment, an electrode is not provided right on the photonic crystal layer 902, which is a different point from the case of a photonic crystal layer 104.

The photonic crystal layer 902, a light guide layer 901, a cladding layer 107 and an n-GaN layer 106 are formed from an n-type GaN-based material which has lower electric resistivity than a p-type GaN-based material. Therefore, even though the device has a structure of injecting electrons from the lateral side in this way, the electric resistance of the device does not largely increase.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-109883, filed Apr. 21, 2008, which is hereby incorporated by reference herein in its entirety.

What is claimed is:

1. A surface emitting laser which oscillates at a wavelength $\lambda$ of a blue band, comprising:
a photonic crystal layer including a photonic crystal structure;
an active layer provided on one surface of the photonic crystal layer; and
an electrode provided on the other surface of the photonic crystal layer for injecting electric current into the active layer, wherein
the photonic crystal structure has a thickness of 100 nm or more,
a laser beam is emitted toward a direction opposite to a side of the photonic crystal layer on which the electrode is provided, and
a distance between the electrode and the active layer is 500 nm or less.

2. The surface emitting laser according to claim 1, wherein the photonic crystal structure has a thickness of 400 nm or less.

3. The surface emitting laser according to claim 1, wherein the photonic crystal layer is of a p-type semiconductor.

4. The surface emitting laser according to claim 3, wherein a p-type cladding layer formed of AlGaN is not provided between the photonic crystal layer and the electrode.

5. The surface emitting laser according to claim 1, wherein the photonic crystal layer contacts with the electrode.

6. The surface emitting laser according to claim 1,
wherein the photonic crystal layer has a structure including a multilayer reflector, and
wherein the multilayer reflector is structured so that two types of semiconductor layers having different refractive indices are laminated.

7. The surface emitting laser according to claim 1, further comprising a multilayer reflector of a semiconductor in a region closer to an outgoing side of the laser beam than the photonic crystal layer.

8. The surface emitting laser according to claim 1, further comprising another photonic crystal layer in a region closer to an outgoing side of the laser beam than the photonic crystal layer.

9. A surface emitting laser which oscillates at a wavelength $\lambda$, comprising:
a photonic crystal layer including a photonic crystal structure;
an active layer provided on one surface of the photonic crystal layer; and
an electrode provided on the other surface of the photonic crystal layer for injecting electric current into the active layer, wherein
the photonic crystal structure has a thickness of 0.50 times or more than the wavelength $\lambda$ in the photonic crystal layer,
a laser beam is emitted toward a direction opposite to the side of the photonic crystal layer on which the electrode is provided, and
a distance between the electrode and the active layer is 500 nm or less.

10. The surface emitting laser according to claim 9, wherein the photonic crystal layer contacts with the electrode.

* * * * *